(12) United States Patent
Azordegan et al.

(10) Patent No.: US 7,423,269 B1
(45) Date of Patent: Sep. 9, 2008

(54) AUTOMATED FEATURE ANALYSIS WITH OFF-AXIS TILTING

(75) Inventors: Amir Azordegan, Santa Clara, CA (US);
Hedong Yang, Santa Clara, CA (US);
Gongyuan Qu, San Jose, CA (US);
Gian Francesco Lorusso, Leuveen (BE)

(73) Assignee: KLA-Tencor Technologies Corporation, Milpitas, CA (US)

(*) Notice: Subject to any disclaimer, the term of this patent is extended or adjusted under 35 U.S.C. 154(b) by 258 days.

(21) Appl. No.: 11/360,325

(22) Filed: Feb. 22, 2006

Related U.S. Application Data

(60) Provisional application No. 60/656,754, filed on Feb. 26, 2005.

(51) Int. Cl.
*G21K 7/00* (2006.01)
*G21N 23/00* (2006.01)

(52) U.S. Cl. .............. 250/311; 250/306; 250/307; 250/309; 250/310; 250/442.11; 250/492.1; 250/492.3; 250/559.2; 250/559.24; 356/625; 356/634; 356/635; 356/636; 356/640

(58) Field of Classification Search .............. 250/492.2, 250/306, 307, 309–311, 397, 396 R, 442.11, 250/492.1, 492.22, 492.3, 559.2, 559.24, 250/559.22; 356/604, 625, 626, 634, 635, 356/636, 640, 243.1, 601; 430/296, 942
See application file for complete search history.

(56) References Cited

U.S. PATENT DOCUMENTS

| | | | |
|---|---|---|---|
| 4,136,285 A * | 1/1979 | Anger et al. .............. 250/492.2 |
| 4,578,587 A * | 3/1986 | Behringer et al. ......... 250/492.2 |
| 6,744,048 B2 | 6/2004 | Hosokawa et al. |
| 6,756,590 B2 | 6/2004 | Kazui et al. |
| 6,791,082 B2 * | 9/2004 | Komuro et al. ............. 250/307 |
| 6,791,096 B2 * | 9/2004 | Komuro et al. ........... 250/492.2 |
| 6,815,675 B1 * | 11/2004 | Lorusso et al. ............... 250/307 |
| 6,852,974 B2 | 2/2005 | Kochi et al. |
| 6,995,369 B1 * | 2/2006 | Lent et al. .................... 250/307 |
| 7,276,690 B1 * | 10/2007 | Lorusso et al. ............... 250/307 |
| 7,317,523 B2 * | 1/2008 | Wertsman et al. ......... 356/243.1 |
| 2003/0038250 A1* | 2/2003 | Komuro et al. ........... 250/492.2 |
| 2003/0106999 A1* | 6/2003 | Komuro et al. ............. 250/307 |
| 2005/0116164 A1* | 6/2005 | Goldenshtein et al. ...... 250/311 |
| 2006/0187447 A1* | 8/2006 | Wertsman et al. ......... 356/243.1 |
| 2007/0018099 A1* | 1/2007 | Chitturi et al. .............. 250/310 |
| 2007/0051888 A1* | 3/2007 | Rosenberg et al. .......... 250/310 |
| 2007/0158567 A1* | 7/2007 | Nakamura et al. .......... 250/311 |

* cited by examiner

*Primary Examiner*—Bernard E Souw
(74) *Attorney, Agent, or Firm*—Okamoto & Benedicto LLP

(57) ABSTRACT

One embodiment relates to a method of automated microalignment using off-axis beam tilting. Image data is collected from a region of interest on a substrate at multiple beam tilts. Potential edges of a feature to be identified in the region are determined, and computational analysis of edge-related data is performed to positively identify the feature(s). Another embodiment relates to a method of automated detection of undercut on a feature using off-axis beam tilting. For each beam tilt, a determination is made of difference data between the edge measurement of one side and the edge measurement of the other side. An undercut on the feature is detected from the difference data. Other embodiments are also disclosed.

13 Claims, 14 Drawing Sheets

AUTOMATED FEATURE ANALYSIS WITH OFF-AXIS TILTING

CROSS-REFERENCE TO RELATED APPLICATION

The present application claims the benefit of U.S. provisional patent application No. 60/656,754, entitled "Automated microalignment with off-axis tilting," filed Feb. 26, 2005 by Amir Azordegan, Hedong Yang, Gongyuan Qu, and Gian Francesco Lorusso. The disclosure of the aforementioned U.S. provisional patent application is hereby incorporated by reference in its entirety.

BACKGROUND OF THE INVENTION

1. Field of the Invention

The present invention relates generally to automated measurement and inspection apparatus and methods of using same.

2. Description of the Background Art

The measurement of dense lines in integrated circuit technology is rapidly acquiring a more and more relevant role. Such dense features are, for example, are sometimes the target for critical dimension (CD) measurements by CD scatterometry tools. These dense features may often have a one-to-one (1:1) line-to-space aspect ratio. CD scatterometry tools include, for example, a CD scanning electron microscope (SEM).

Unfortunately, the automated measurement of such kinds of structures with a CD-SEM is often problematic, because it can be extremely difficult to distinguish between a line and a trench when the line-to-space aspect difficult to distinguish between a line and a trench when the line-to-space aspect ratio is close to one. This is because the templates for lines and spaces may be very similar in such cases. As a consequence, failures of measuring the intended feature results in erroneous measurement data (flyers) and, consequently, in reduced precision in a critical dimension measurement. Erroneous data may also occur due to operator error, such as, for example, when an operator is setting up a recipe (procedure) and does not recognize proper placement of gates (selected regions) from a top-down view image.

To avoid such erroneous data, a conventional approach locates a target feature to measure by using micro-alignment or pattern recognition. In the conventional approach, a template is used to recognize the feature.

It is desirable to improve CD-SEM and other apparatus which operate using similar principles.

SUMMARY

Figure 1:
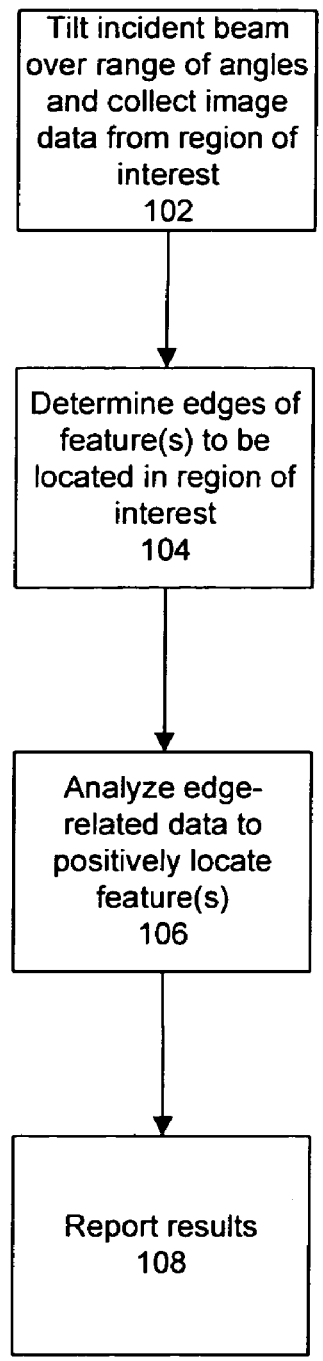
FIG. 1 is a high-level flow chart depicting an automated method of identifying a feature or features in a region of interest as a line or trench in accordance with an embodiment of the invention.

One embodiment of the invention relates to a method of automated microalignment using off-axis beam tilting. Image data is collected from a region of interest on a substrate at multiple beam tilts. Potential edges of a feature to be located in the region are determined, and computational analysis of edge-related data is performed to identify the feature. The edge-related data may comprise edge width data and/or edge intensity data. The beam may be tilted electrostatically, or may alternately be achieved by other mechanisms.

Another embodiment pertains to a scattering metrology apparatus. The apparatus includes at least a stage to hold a substrate, a beam source to generate an incident beam, a mechanism for controllably providing a tilt between the incident beam and the substrate, and a processor to control the apparatus. The apparatus also includes processor-executable code configured to obtain image data from a region of interest on the substrate at multiple off-axis tilts, find potential edges of a feature to be located in the region; and process edge-related data to positively locate the feature.

Another embodiment of the invention relates to a method of automated undercut detection using off-axis beam tilting. Image data is collected from a region of interest on a substrate at multiple beam tilts. Edges of feature(s) of interest in the region are located, and computational analysis of edge-related data is performed to detect undercut at the edges.

Another embodiment relates to a method of automated detection of undercut on a feature using off-axis beam tilting. For each beam tilt, a determination is made of difference data between the edge measurement of one side and the edge measurement of the other side. An undercut on the feature is detected from the difference data.

Other embodiments are also disclosed.

DETAILED DESCRIPTION

One of many challenges process or metrology engineers face is incorrect flagging on a process control chart. This could be a result of, for example, an un-optimized recipe that measures a wrong feature (for example, a space instead of a line), or a feature placement error due to tool limitations.

Such incorrect flagging of potential process errors can be a costly problem in a fabrication facility because processes may be put on hold and backlogs may be built up unnecessarily. Often many hours are spent by operators re-inspecting wafer lots and by process or metrology engineers re-qualifying the recipes.

Automated Microalignment with Off-Axis Tilting

While most conventional CD-SEMs use algorithms employing pattern matching and contrast difference to differentiate between line and space. However, the shrinking node requirement, and one-to-one line-to-space ratios have revealed limitations in these algorithms.

The present application discloses a robust technique of automated micro-alignment using off-axis beam tilting to accurately identify, or confirm identification of, a feature or features. The features do not necessarily have to be centered in the field of view of the instrument for the technique to work. In particular, lines and spaces between lines may be rapidly distinguishable in an automated manner using this technique. The lines and spaces may be distinguished even if they are of similar widths and even if there is low contrast difference between the two.

The disclosed technique advantageously enables for fully automated metrology recipes without a need to use pattern recognition. The technique is particularly advantageous to overcome problems relating to feature measurements in dense arrays with aspect ratios close to one. Due to the robust nature of this technique, greater tolerance for error may be allowed in recipe setup and placement. Based on the correct identification of the feature, a subsequent metrology measurement may be set accordingly. The technique may be advantageously applied in waferless design based metrology, where there is limited prior knowledge of the wafer.

In alternate embodiments, the technique may also be applied advantageously for other purposes. For example, it may be applied to accurately flag undercuts of edges.

FIG. 1 is a high-level flow chart depicting an automated method of identifying a feature or features in a region of interest as a line or space in accordance with an embodiment of the invention. The method may be performed in a CD-SEM apparatus or in similar apparatus.

Image data is collected 102 from the region of interest using an incident beam tilted over a range or set of angles. In one implementation, the set of angles for the tilt may be −2 degrees, −1 degrees, 0 degrees, +1 degrees and +2 degrees. Other ranges or sets of angles may also be used. A system operator may be able to set an angle range as a parameter. In a preferred embodiment of the invention, the beam tilt may be performed electrostatically. In alternate embodiments, the change in tilt between the beam and the substrate may be achieved by other mechanisms. For example, the substrate stage may be tilted through a range or set of angles.

The edges of the feature(s) to be identified within the region of interest may then be located 104. This step may be automated using image analysis algorithms. In some embodiments, shifts in the image data due to the beam tilts may also be determined. This determination may be used in some embodiments of the invention, but may not be needed in other embodiments of the invention. This step may also be automated using image analysis algorithms.

Edge-related data is then analyzed 106 to identify or confirm identification of the feature(s) in the region of interest. In one embodiment, the feature(s) may be identified as either a line or a space. This particular embodiment is discussed in further detail herein.

The result of the analysis may then be reported 108. The results may include an identification of the feature (for example, as a trench or a line). The results may also indicate a specific location of an identified feature. For example, linear positions for left and right sides of a line or trench may be reported.

In accordance with an embodiment of the invention, a critical dimension (CD) measurement may then be performed on the identified feature(s). For example, a line width may be measured for each line in the region of interest. The results may then be used, for example, to monitor a fabrication process. For example, line widths outside of a tolerance range may be flagged.

Figure 2A:
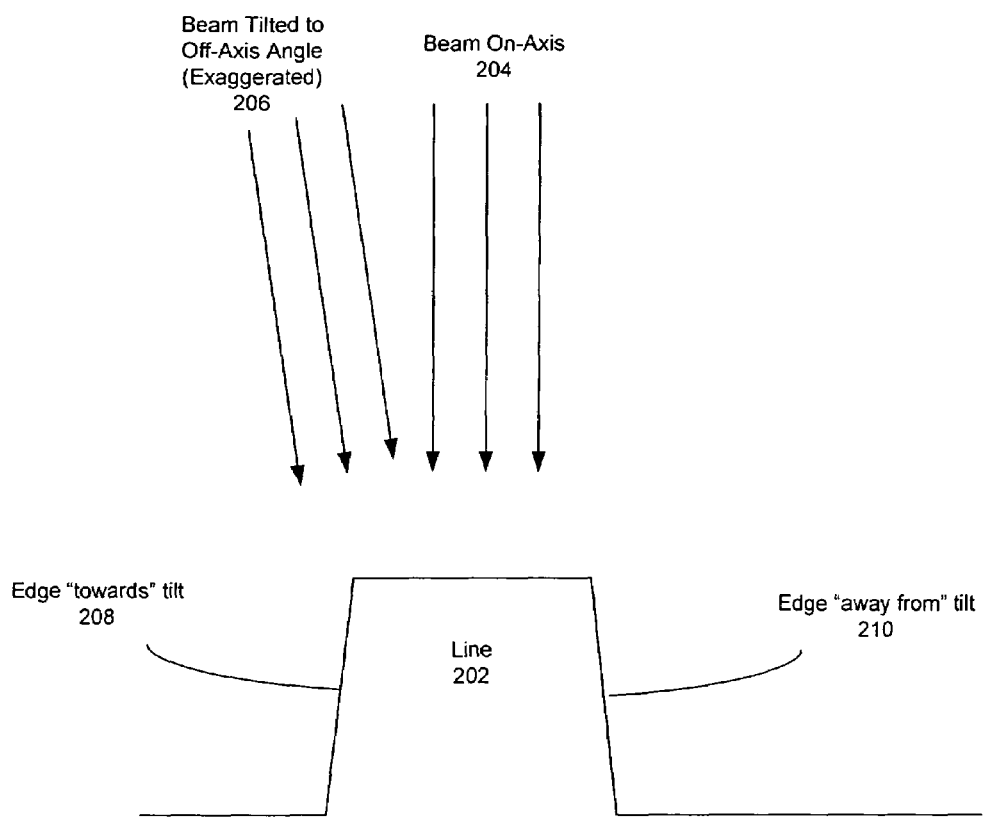
FIG. 2A is a schematic diagram of a line feature under illumination from untilted and tilted beams in accordance with an embodiment of the invention.
Figure 3:
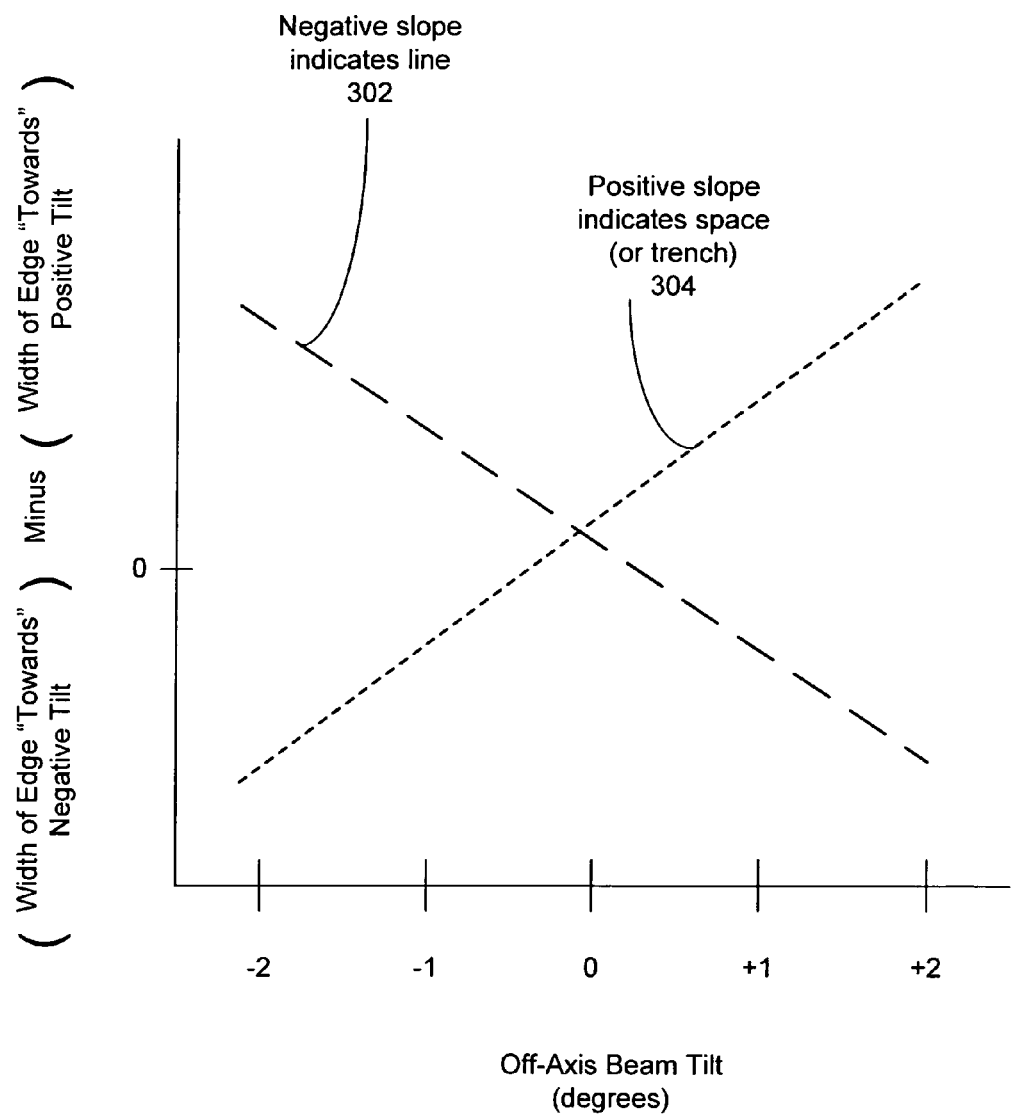
FIG. 3 is a graphic diagram of a difference in edge width versus off-axis beam tilt in accordance with an embodiment of the invention.

FIG. 2A is a schematic diagram of a line feature 202 under illumination from untilted 204 and tilted 206 beams in accordance with an embodiment of the invention, wherein beam 206 has a negative tilt angle corresponding to FIG. 3. For illustrative purposes, the tilted beam is shown tilted at an off-axis angle that is exaggerated compared with a preferred tilt range. Two edges of the line 202 are also shown. One edge 208 is "towards" the direction of the beam tilt, while the other edge 210 is "away from" the direction of the beam tilt.

In accordance with an embodiment of the invention, in the data collected during the beam tilt, the edge towards the tilt 208 should appear with a larger edge width than the edge width for the edge away from the tilt 210. In accordance with another embodiment of the invention, in the data collected during the beam tilt, the edge towards the tilt 208 should appear with a greater intensity than the edge intensity for the edge away from the tilt 210.

Figure 2B:
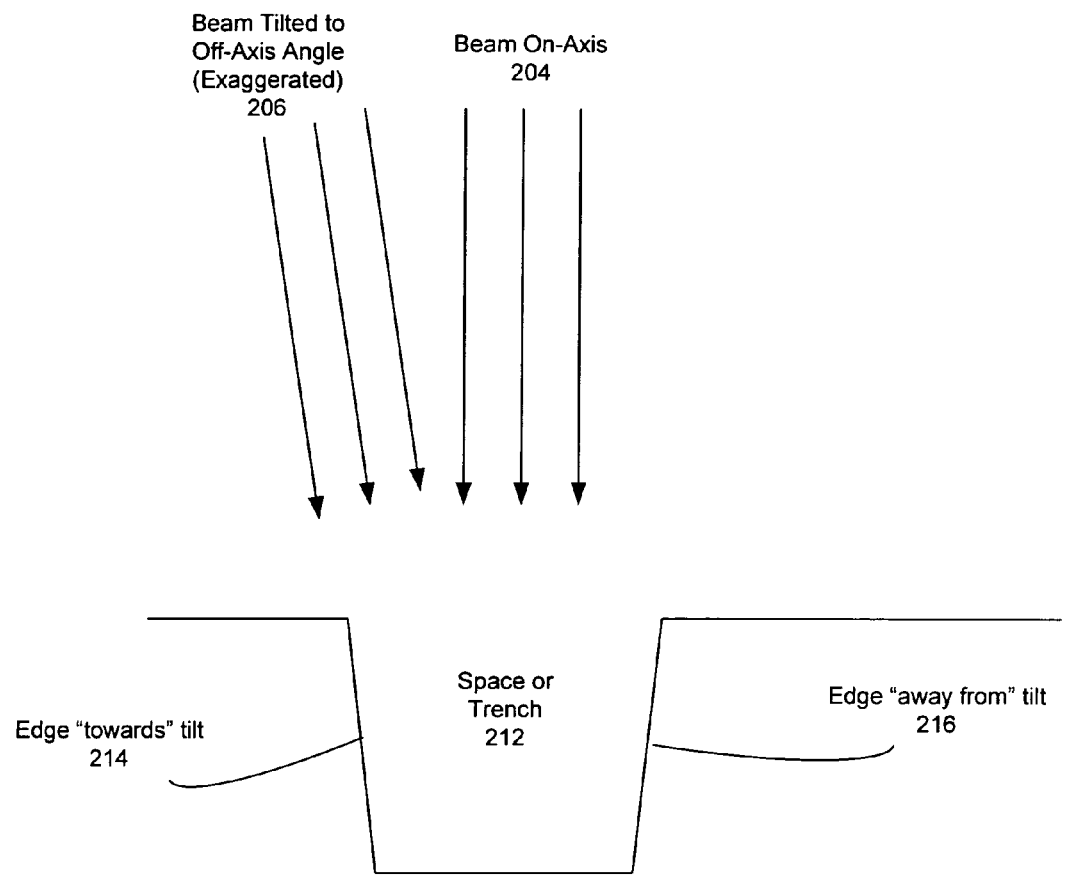
FIG. 2B is a schematic diagram of a space or trench feature under illumination from untilted and tilted beams in accordance with an embodiment of the invention.

FIG. 2B is a schematic diagram of a space or trench feature 212 under illumination from untilted 204 and tilted 206 beams in accordance with an embodiment of the invention. For illustrative purposes, the tilted beam is shown tilted at an off-axis angle that is exaggerated compared with a preferred tilt range. Two edges of the space or trench 212 are also shown. One edge 214 is "towards" the direction of the negative beam tilt 206, while the other edge 216 is "away from" the direction of the beam tilt.

In accordance with an embodiment of the invention, in the data collected during the beam tilt, the edge towards the tilt 214 should appear with a smaller edge width than the edge width for the edge away from the tilt 216. In accordance with another embodiment of the invention, in the data collected during the beam tilt, the edge towards the tilt 214 should appear with a lesser intensity than the edge width for the edge away from the tilt 216.

FIG. 3 is a graphic diagram of a difference in edge width versus off-axis beam tilt in accordance with an embodiment of the invention. For this graph, the difference in edge width is defined as the width of an edge "towards" a negative angle tilt minus the width of an adjacent edge "towards" a positive angle tilt. This difference is graphed versus the off-axis beam tilt.

Two expected trend lines are shown in FIG. 3. Which trend line is observed depends upon whether a feature between adjacent lines is identified as a line or a space. A negative sloping trend line 302 indicates that the feature is a line. A positive sloping trend line 304 indicates that the feature is a space.

Figure 4:
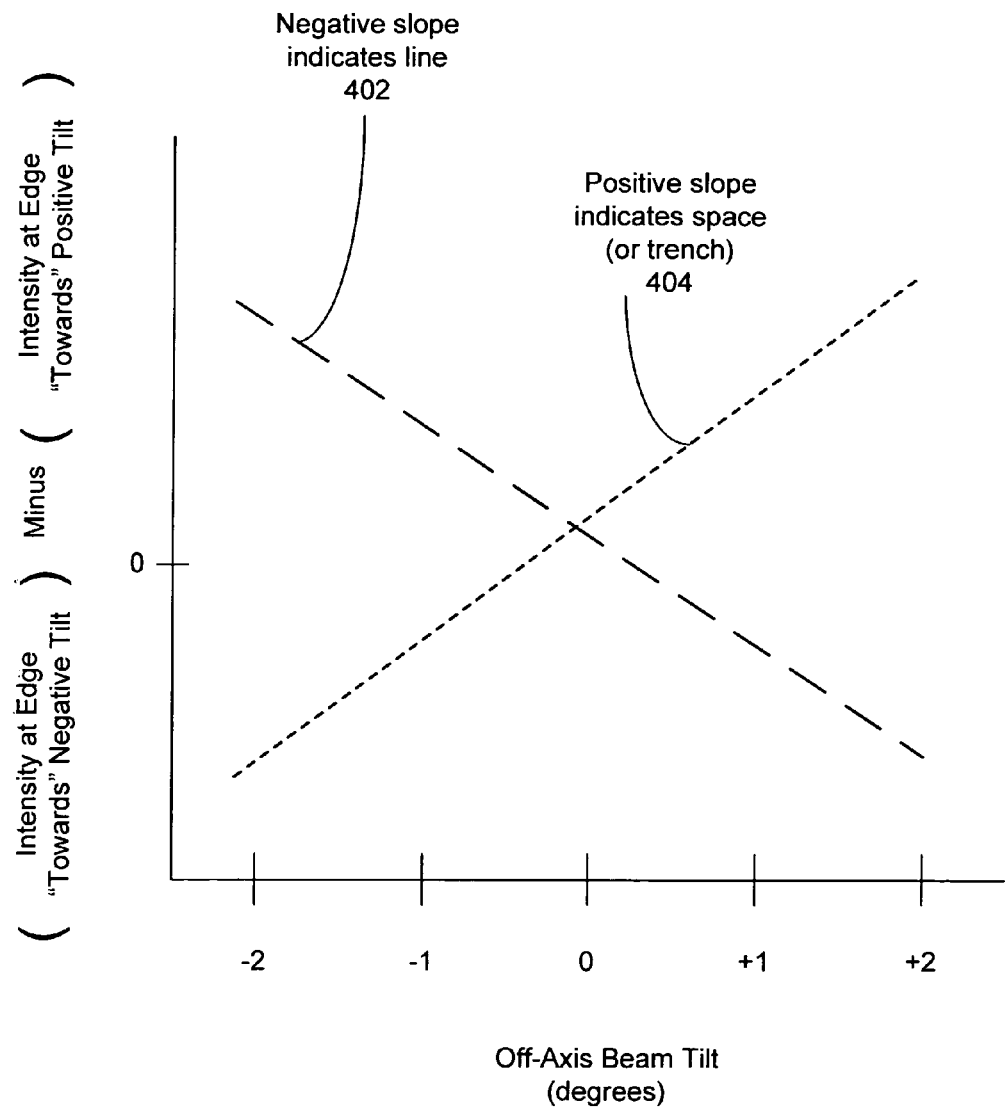
FIG. 4 is a graphic diagram of a difference in edge intensity versus off-axis beam tilt in accordance with an embodiment of the invention.

FIG. 4 is a graphic diagram of a difference in edge intensity versus off-axis beam tilt in accordance with an embodiment of the invention. For this graph, the difference in edge intensity is defined as the intensity of an edge "towards" a negative angle tilt minus the intensity of an adjacent edge "towards" a positive angle tilt. This difference is graphed versus the off-axis beam tilt.

Two expected trend lines are shown in FIG. 3. Which trend line is observed depends upon whether a feature between adjacent lines is identified as a line or a space. A negative sloping trend line 402 indicates that the feature is a line. A positive sloping trend line 404 indicates that the feature is a space.

Figure 5:
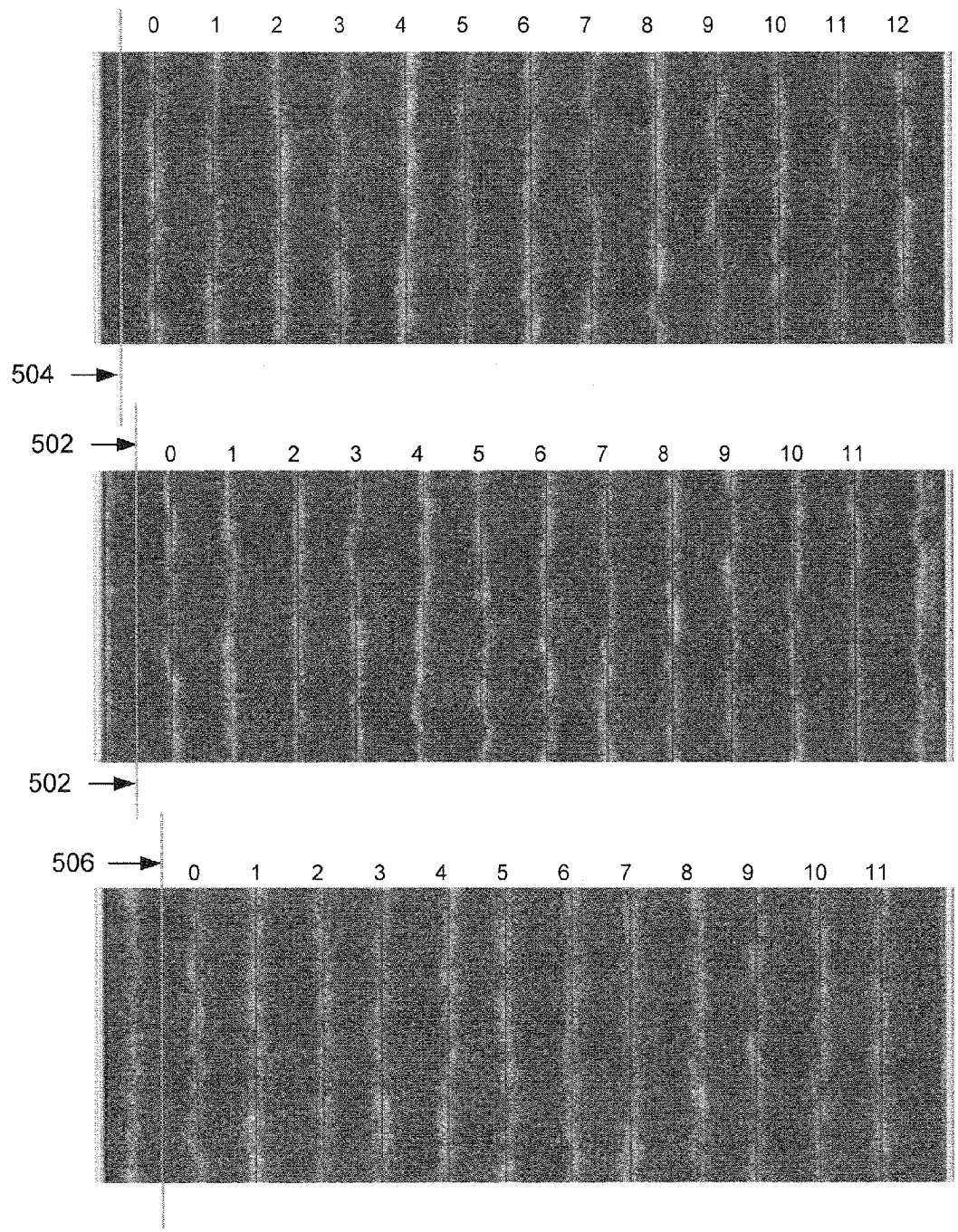
FIG. 5 shows three images collected from a region of interest at different beam tilts in accordance with an embodiment of the invention.

FIG. 5 shows three images collected from a region of interest at different beam tilts. The top image shows data collected with the beam tilted at negative one degree. The middle image shows data collected with the beam untilted. The top image shows data collected with the beam tilted at positive one degree. Edges between lines and spaces (or trenches) in the images are numbered from 0 through 12.

A starting location $S_0$ 502 is shown in the middle image. The shift in $S_0$ to the left 504 is indicated for the top image, while the shift in $S_0$ to the right 506 is indicated for the bottom image.

Figure 6:
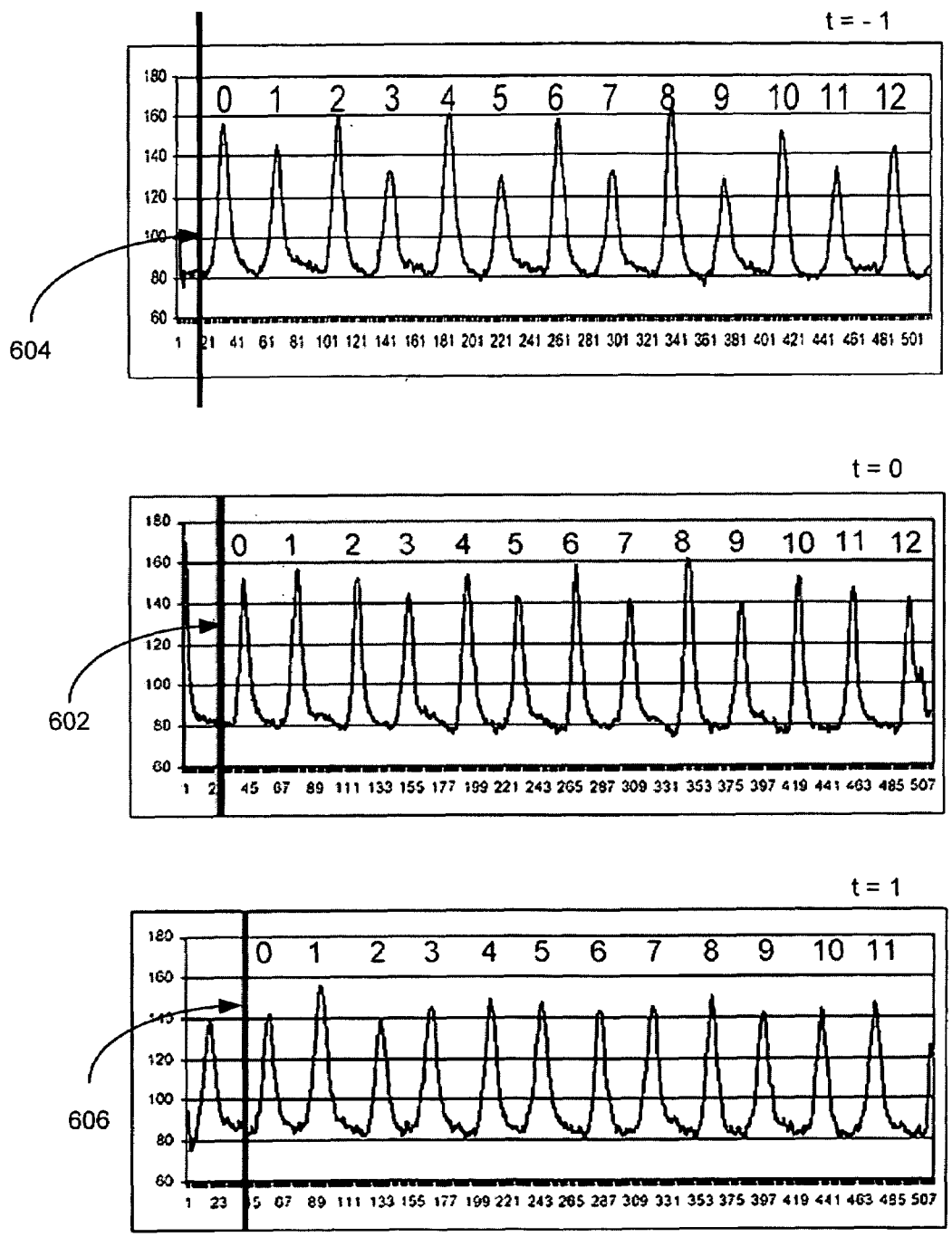
FIG. 6 illustrates one method of determining the image shifts due to beam tilting in accordance with an embodiment of the invention.

FIG. 6 illustrates one method of determining the image shifts due to beam tilting in accordance with an embodiment of the invention. The top plot shows a profile of intensity versus linear position in the image collected with beam tilt at negative on degrees. The middle plot shows a profile of intensity versus linear position in the image collected with beam untilted. The bottom plot shows a profile of intensity versus linear position in the image collected with beam tilt at positive on degrees. Peaks in the profiles are numbered from 0 through 12. The peaks correspond to edges between lines and spaces (or trenches) in the images A starting location $S_0$ 602 is shown in the middle profile. The shift in $S_0$ to the left 604 is indicated for the top profile, while the shift in $S_0$ to the right 606 is indicated for the bottom profile.

Figure 7A:
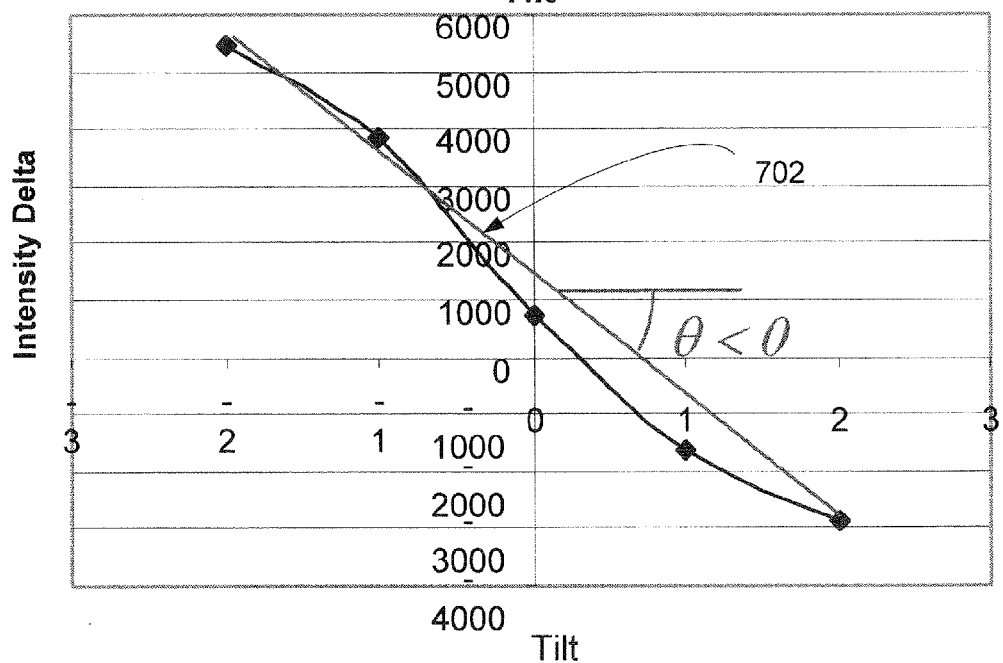
FIGS. 7A and 7B show hypothetical examples of the analysis of image data from a region of interest having a series of lines with spaces in between in accordance with an embodiment of the invention.
Figure 7A:
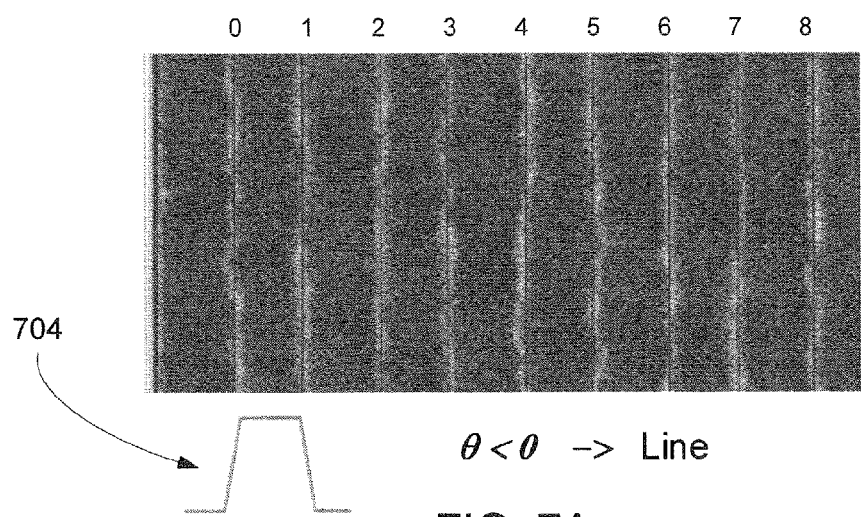

FIG. 7A shows a hypothetical example of the analysis of image data from a region of interest having a series of lines with spaces in between. As shown in the image on the right side, the line/space edges are numbered from zero through eight (0 through 8).

As shown in the plot on the top of FIG. 7A, the image data is collected over a tilt range from negative two degrees to positive two degrees, with an increment of one degree between tilts. For each tilt, a calculation is made as to the even-odd edge intensity difference. The even-odd edge intensity difference is the difference between an average intensity of even edges and an average intensity of odd edges. As shown in the plot, the data shows a negative sloping trend line 702. In this case, the negative sloping trend line 702 indicates that a line feature 704 (rather than a space feature) is present between edges numbered zero and one. Hence, in this example, features with an even edge on the left side and an odd edge on the right side comprise lines, while features with an odd edge of the left side and an even edge on the right side comprises spaces (or trenches).

Figure 7B:
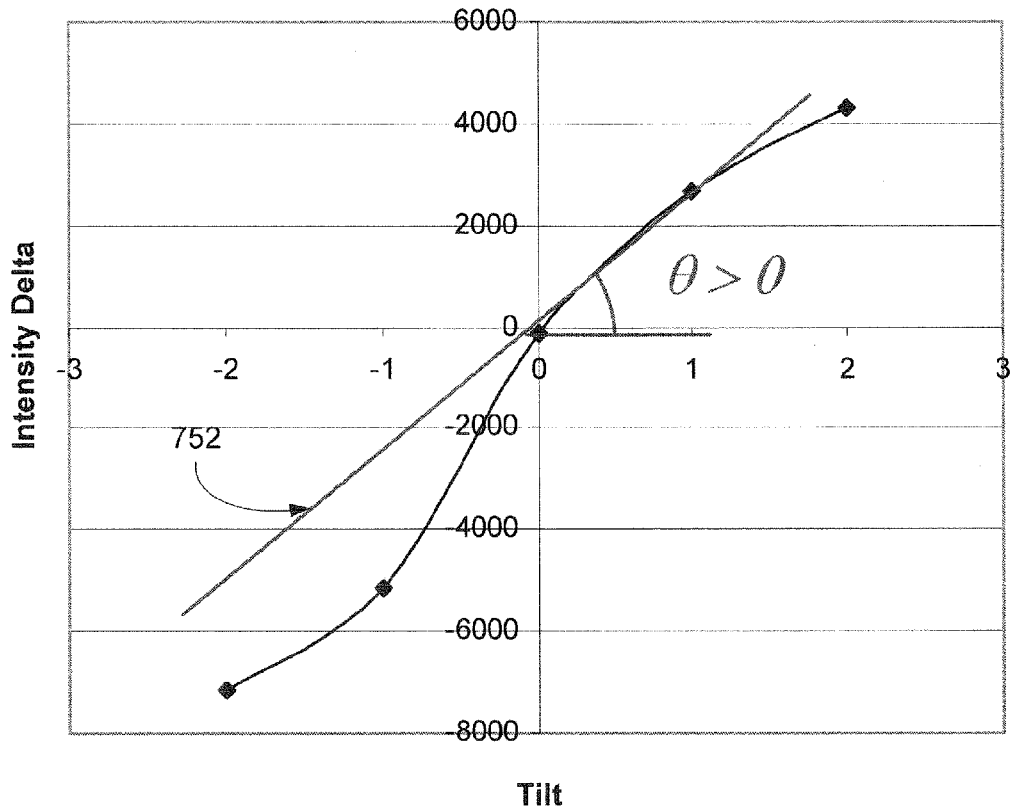
Figure 7B:
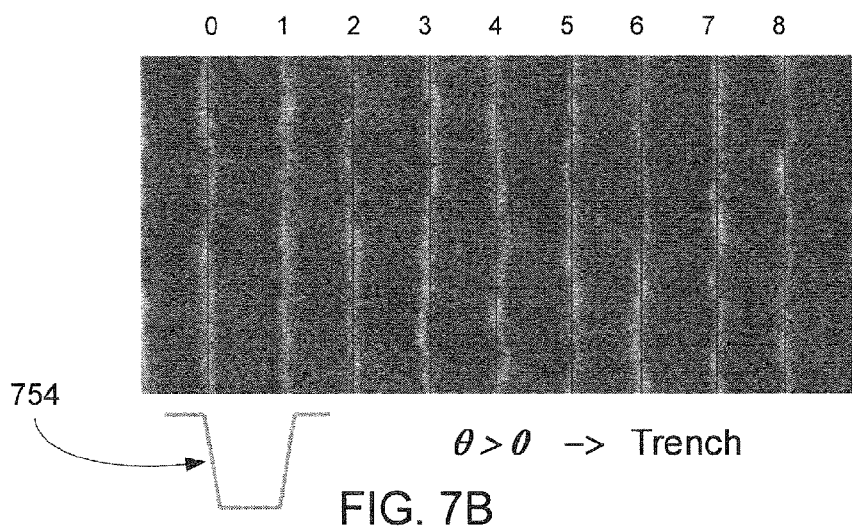

FIG. 7B shows another hypothetical example of the analysis of image data from a region of interest having a series of lines with spaces in between. As shown in the image on the right side, the line/space edges are again numbered from zero through eight (0 through 8).

As shown in the plot on the left side, the image data is collected over a tilt range from negative two degrees to positive two degrees, with an increment of one degree between tilts. For each tilt, a calculation is made as to the even-odd edge intensity difference. The even-odd edge intensity difference is the difference between an average intensity of even edges and an average intensity of odd edges. As shown in the plot, the data shows a positive sloping trend line 752. In this case, the positive sloping trend line 752 indicates that a space (or trench) feature 754 is present between edges numbered zero and one. Hence, in this example, features with an even edge on the left side and an odd edge on the right side comprise spaces, while features with an odd edge of the left side and an even edge on the right side comprises lines.

As mentioned above under Cross-Reference to Related Application, the present application incorporates by reference U.S. provisional patent application No. 60/656,754, entitled "Automated microalignment with off-axis tilting," filed Feb. 26, 2005 by Amir Azordegan, Hedong Yang, Gongyuan Qu, and Gian Francesco Lorusso ("the provisional application"). The provisional application discloses a specific implementation of a procedure for acquiring image data for a range of tilts and discloses specific implementations of procedures for automated microalignment using beam-tilted image data.

A procedure for automated microalignment using beam-tilted image data may determine a starting point within the zero-degree (untilted) profile and build a template from the zero degree profile. The tilted beam profiles may then be aligned to the zero-degree profile. The average edge intensity differences (between even and odd edges) may then be calculated for each profile. A slope of average intensity difference versus tilted angle may then be calculated. The slope may be used to determine whether the feature at the starting point is a line or a trench (space).

A procedure for automated microalignment using beam-tilted image data may utilize edge width difference data and/or edge intensity difference data. In some cases, the analysis using the edge width difference data cannot identify the feature type with sufficient certainty. For example, the analysis may not be able to unambiguously identify a feature as a line or a space between lines. In such a case, the procedure may then use the edge intensity difference data to identify, if possible, the feature type.

Figure 8:
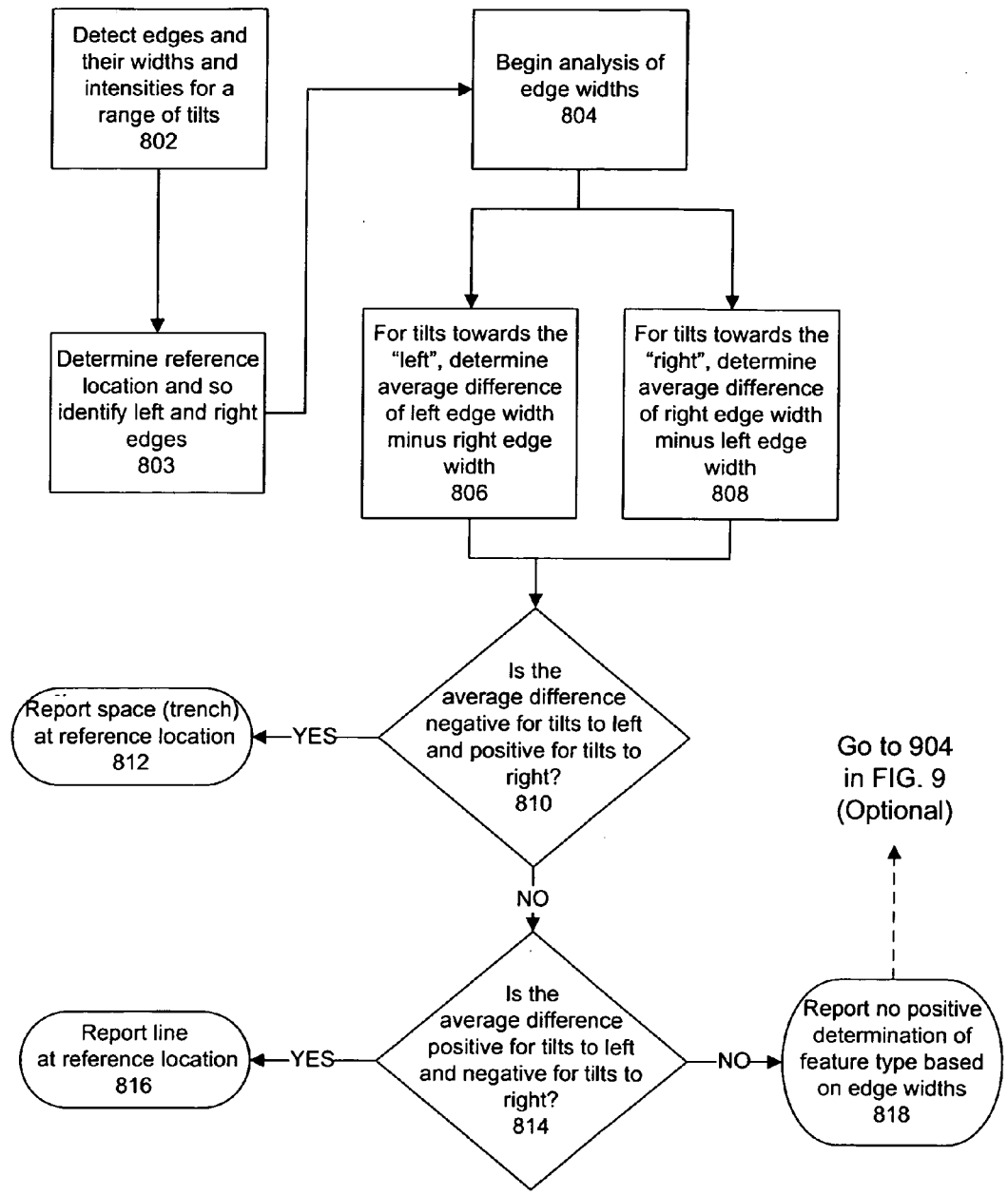
FIG. 8 depicts a procedure to distinguish between lines and spaces using edge width analysis in accordance with an embodiment of the invention.

FIG. 8 depicts an example procedure 800 to distinguish between lines and spaces using edge width analysis in accordance with an embodiment of the invention. As preliminary steps, images are captured for a range of beam tilts, and edges and their widths and intensities are detected 802. A reference location is determined so that left (for example, even numbered edges) and right edges (for example, odd numbered edges) may be identified 803 in relation to the reference location. In relation to FIG. 7A, for example, the left edges may correspond to even numbered edges, and the right edges may correspond to odd numbered edges, or vice versa.

Analysis of the edge width data may then begin 804. The average difference of the width of the left edges minus the width of the right edges may be calculated separately for tilts towards the "left" (see 806) and for tilts towards the "right" (see 808). For example, tilts towards the left may correspond to negative degree tilts, and tilts towards the right may correspond to positive degree tilts.

Logic may then be implemented so as to determine 810 if the calculated average difference is negative for tilts towards the left and positive for tilts towards the right. If this first determination 810 is true, then we have the case shown by the illustrative line 304 with positive slope in FIG. 3. Hence, a space (trench) may be reported 812 as being positively determined at the reference location.

If this first determination 810 is false, then the logic may go on to determine 814 if the calculated average difference is positive for tilts towards the left and negative for tilts towards the right. If this second determination 814 is true, then we have the case shown by the illustrative line 302 with negative slope in FIG. 3. Hence, a line may be reported 816 as being positively determined at the reference location.

If this second determination 814 is false, then it may be reported 818 that no positive determination has been made as to the feature type at the reference location based on the edge width analysis. Optionally, the procedure 800 may be configured to then go to block 904 in FIG. 9 so as to perform an analysis of edge intensities in a further attempt to make a positive determination of the feature type.

Figure 9:
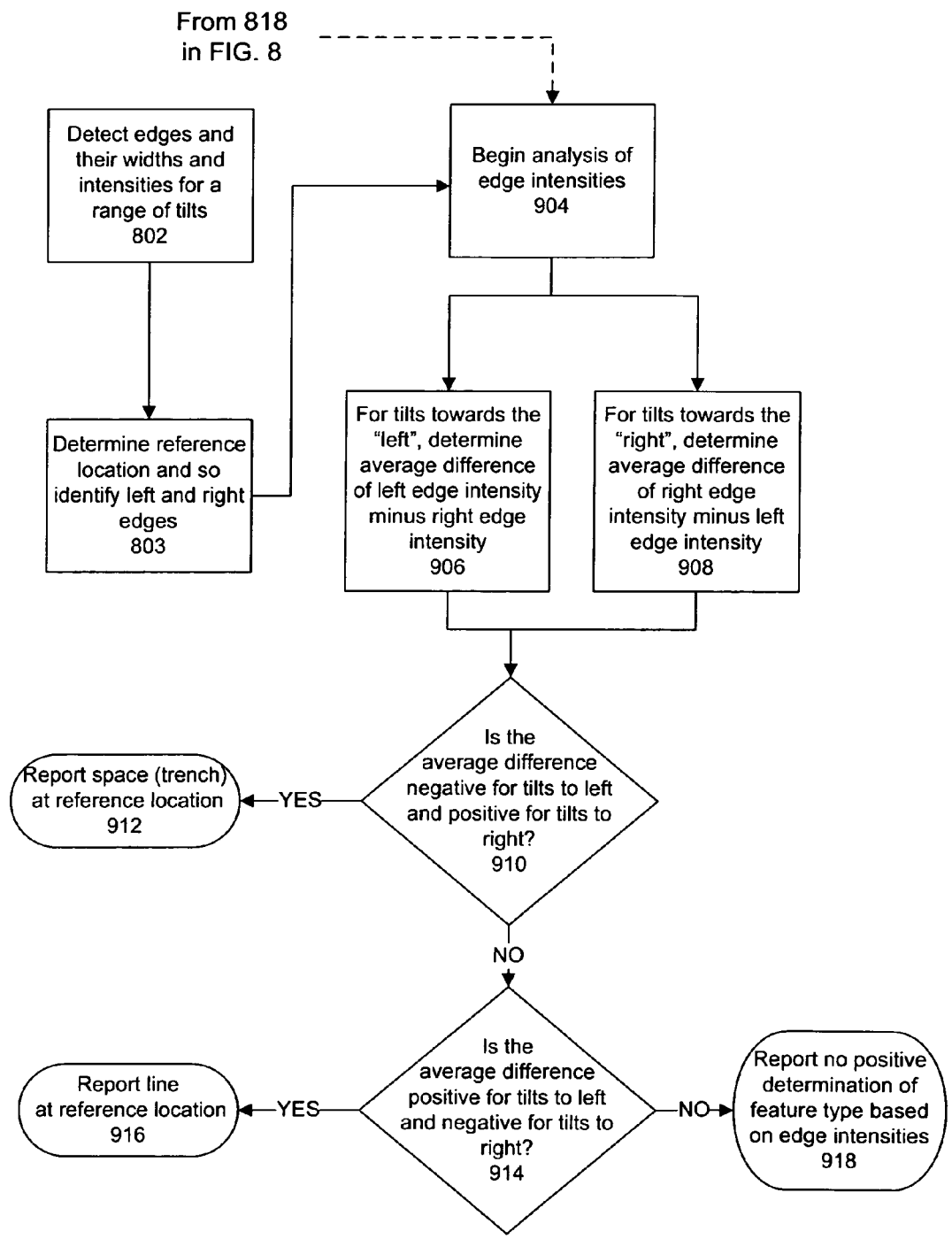
FIG. 9 depicts a procedure to distinguish between lines and spaces using edge intensity analysis in accordance with an embodiment of the invention.

FIG. 9 depicts an example procedure 900 to distinguish between lines and spaces using edge intensity analysis in accordance with an embodiment of the invention. Like in FIG. 8, as preliminary steps, images may be captured for a range of beam tilts, and edges and their widths and intensities may be detected 802. A reference location may be determined so that left (for example, even numbered edges) and right edges (for example, odd numbered edges) may be identified 803 in relation to the reference location. In relation to FIG. 7A, for example, the left edges may correspond to even numbered edges, and the right edges may correspond to odd numbered edges, or vice versa. Alternatively, these preliminary steps may not be necessary if the edge intensity analysis is begun 904 after the edge width analysis of FIG. 8 (see arrow from block 818 in FIG. 8 to block 904 in FIG. 9).

Once analysis of the edge intensity data begins 904, the average difference of the intensity of the left edges minus the intensity of the right edges may be calculated separately for tilts towards the "left" (see 906) and for tilts towards the "right" (see 908). For example, tilts towards the left may correspond to negative degree tilts, and tilts towards the right may correspond to positive degree tilts.

Logic may then be implemented so as to determine 910 if the calculated average difference is negative for tilts towards the left and positive for tilts towards the right. If this first determination 910 is true, then we have the case shown by the illustrative line 404 with positive slope in FIG. 4. Hence, a space (trench) may be reported 912 as being positively determined at the reference location.

If this first determination 910 is false, then the logic may go on to determine 914 if the calculated average difference is positive for tilts towards the left and negative for tilts towards the right. If this second determination 914 is true, then we have the case shown by the illustrative line 402 with negative slope in FIG. 4. Hence, a line may be reported 916 as being positively determined at the reference location.

If this second determination 914 is false, then it may be reported 918 that no positive determination has been made as to the feature type at the reference location based on the edge width analysis.

Another embodiment of the invention relates to automated undercut detection using off-axis beam tilting. Image data is collected from a region of interest on a substrate at multiple off-axis beam tilts. An edge of a feature of interest in the region is located. Computational analysis of edge-related data is performed to detect undercut at the edges. The computational analysis of the edge-related data may calculating a change in a width of the edge as a function of the beam tilt and/or calculating a change in an intensity of the edge as a function of the beam tilt.

Undercut Flagging and Detection

Figure 10:
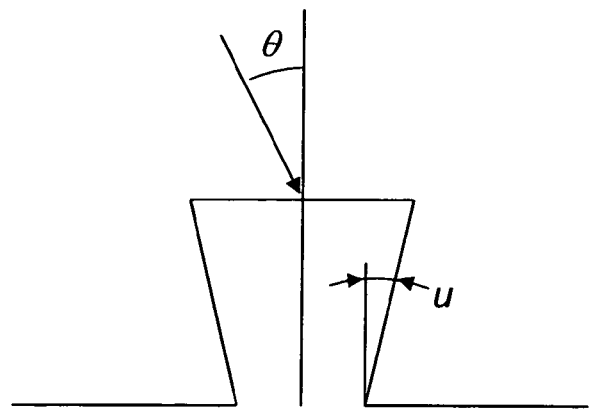
FIG. 10 is a schematic diagram illustrating a surface feature with an undercut.

FIG. 10 is a schematic diagram illustrating a surface feature with an undercut. When scanned by an electron beam at various incident angles θ, a line structure with or without undercut u will exhibit different responses in certain properties such as edge width or edge intensity observed from the images of the structure that are formed by collecting the scattered electrons off the structure. Flagging the existence of such an undercut on the structure or even estimating the amount of the undercut can be achieved by analyzing these response curves as a function of the incident beam angle.

Figure 11:
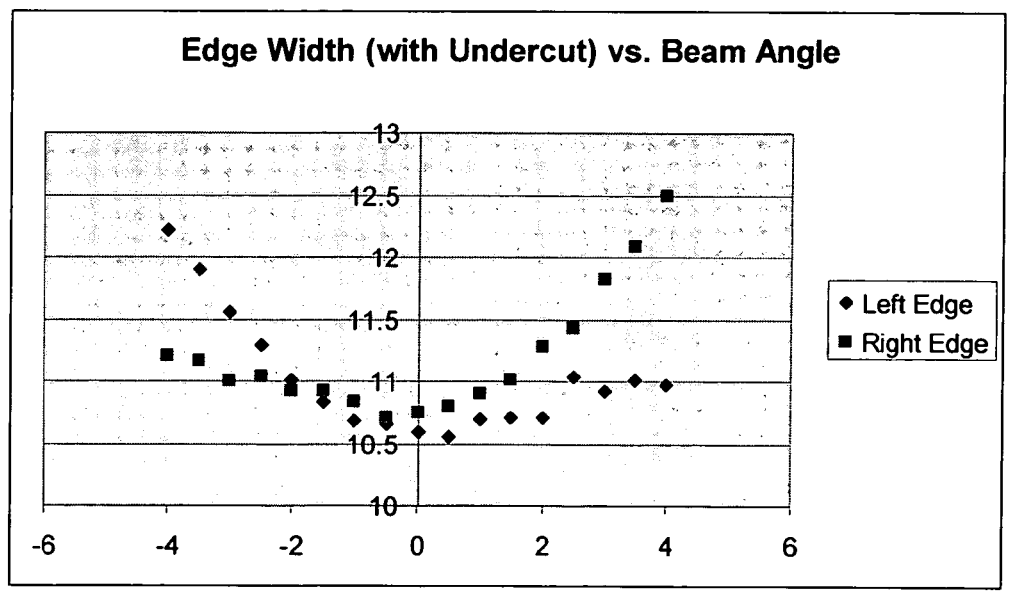
FIG. 11 and FIG. 12 show a typical edge width and edge width difference responses to the incident beam angle when an undercut exists.
Figure 12:
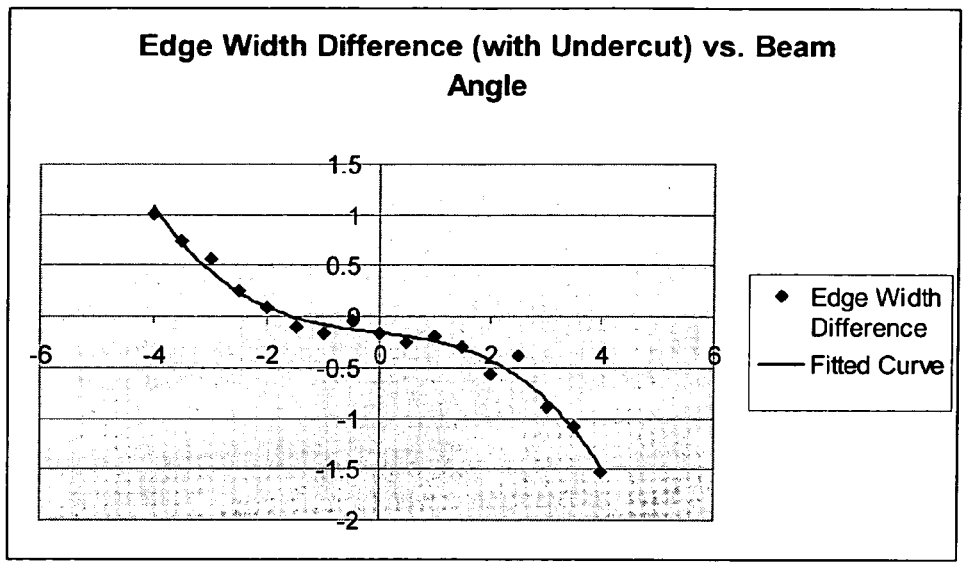

FIG. 11 and FIG. 12 show a typical edge width and edge width difference responses to the incident beam angle when an undercut exists. As seen from FIG. 11, for a negative incident beam angle, the width of the left edge appears greater than the width of the right edge. Meanwhile, for a positive incident beam angle, the width of the right edge appears greater than the width of the left edge.

FIG. 12 shows the difference when the right edge widths are subtracted from the left edge widths. As seen in FIG. 12, the magnitude of the difference is relatively flat near zero beam tilt and increases non-linearly away from zero beam tilt. Such a non-linear dependence is indicative of a feature with undercut.

Figure 13:
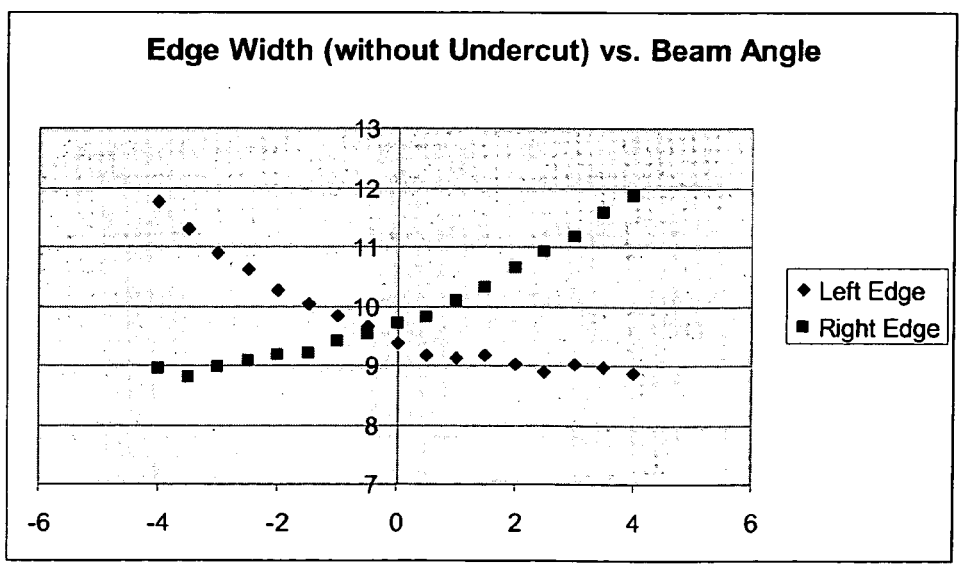
FIG. 13 and FIG. 14 show the responses without undercut.
Figure 14:
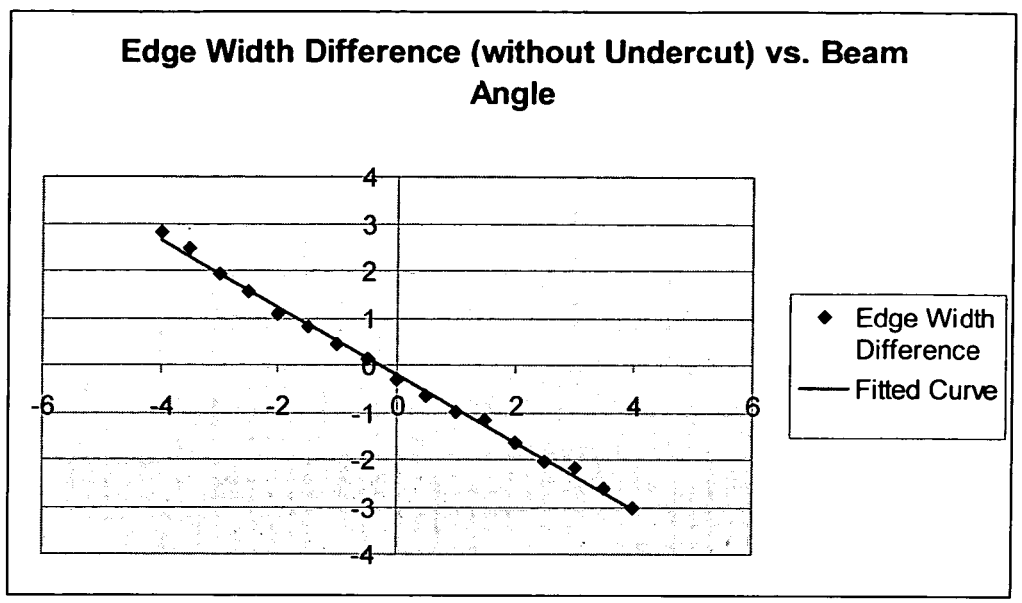

FIG. 13 and FIG. 14 show the responses without undercut. Like in FIG. 11, for a negative incident beam angle, the width of the left edge appears greater than the width of the right edge. Meanwhile, for a positive incident beam angle, the width of the right edge appears greater than the width of the left edge.

FIG. 14 shows the difference when the right edge widths are subtracted from the left edge widths. In this case, the magnitude of the difference appears to be linearly dependent on the incident beam tilt. Such a linear dependence is indicative of a feature without undercut.

Hence, by examining the linearity of the fitted curve to the edge width difference response, the existence of undercut may be determined. Furthermore, by measuring the width of the linear region near zero beam angle (θ=0) on the nonlinear edge width difference curve, the amount of undercut may be estimated. For example, the amount of undercut from FIG. 12 is about 2 degrees.

While the above discussion utilizes the non-linearity of the edge width difference response to detect undercut, undercut may also be detected directly from the edge width data. For example, the edge width response data in FIG. 11 shows substantial non-linearity which is indicative of undercut. On the other hand, the edge width response data in FIG. 13 indicates that there is no undercut.

While the above discussion of undercut detection utilizes edge widths as determined from electron beam images, edge intensities may be used in an alternative embodiment.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of automated microalignment using off-axis beam tilting, the method comprising:
    collecting image data from a region of interest on a substrate at multiple off-axis beam tilts;
    detecting edges of features located in the region, wherein the features comprise lines of material on a substrate and spaces in between the lines of material;
    determining edge widths of the feature edges measured under the multiple beam tilts; and
    distinguishing whether a feature is a line or a space based on an average difference in the edge widths on opposing sides of the feature.

2. The method of claim 1, wherein the beam tilts are performed by electrostatically tilting an incident beam.

3. The method of claim 1, further comprising:
    determining intensities of the feature edges measured under the multiple beam tilts; and
    distinguishing whether a feature is a line or a space based on calculating an average difference in the edge intensities on opposing sides of the feature.

4. A method of automated microalignment using off-axis beam tilting, the method comprising:
    collecting image data from a region of interest on a substrate taken under multiple off-axis beam tilts;
    detecting edges of features located in the region, wherein the features comprise lines of material on a substrate and spaces in between the lines of material;
    determining intensities of the feature edges measured under the multiple beam tilts; and
    distinguishing whether a feature is a line or a space based on calculating an average difference in the edge intensities on opposing sides of the feature.

5. The method of claim 4, wherein the beam tilts are performed by electrostatically tilting an incident beam.

6. A scattering metrology apparatus, the apparatus comprising:
    a specimen to hold a substrate;
    a beam source to generate an incident beam;
    a mechanism for controllably providing an off-axis tilt between the incident beam and the substrate;
    a processor to control the apparatus; and
    processor-executable code configured to obtain image data from a region of interest on the substrate taken under multiple tilts, find edges in the region; and process edge width or intensity data to locate a line feature or a trench feature on the substrate, wherein the line feature comprises a line of material on the substrate, and the trench feature comprises a space in between two lines of material on the substrate.

7. The apparatus of claim 6, wherein the mechanism comprises an electrostatic tilt mechanism.

8. A method of automated undercut detection using off-axis beam tilting, the method comprising:
    collecting image data from a region of interest on a substrate taken under multiple off-axis beam tilts;
    locating an edge of a feature of interest in the region;
    determining edge width or intensity as a function of beam angle tilt; and
    detecting undercut at the edges based on a non-linearity of the edge width or intensity as a function of beam angle tilt.

9. The method of claim 8, further comprising estimating an amount of undercut by measuring a width of a linear region near zero beam angle tilt of the edge width or intensity as a function of beam angle tilt.

10. A method of automated detection of undercut on a feature using off-axis beam tilting, the method comprising:
    collecting image data from the feature on a substrate taken under multiple off-axis beam tilt angles;
    measuring edge width or intensity on both sides of the feature taken under the multiple beam tilt angles;
    for each beam tilt angle, determining a difference between the edge width or intensity measurement of one side and the edge width or intensity measurement of the other side; and
    detecting an undercut on the feature based on a non-linearity of said difference as a function of the beam tilt angle.

11. The method of claim 10, wherein an edge width is measured on both sides of the feature.

12. The method of claim 10, wherein an edge intensity is measured on both sides of the feature.

13. An electron beam apparatus for automated detection of undercut on a feature using off-axis beam tilting, the apparatus comprising:
    means for collecting image data from the feature on a substrate taken under multiple off-axis beam tilts;
    means for measuring edge width or intensity on both sides of the feature taken under the multiple beam tilts; and
    means for determining, for each beam tilt, a difference between the edge width or intensity measurement of one side and the edge width or intensity measurement of the other side; and
    means for detecting an undercut on the feature based on a non-linearity of said difference as a function of the beam tilt angle.

* * * * *